(12) United States Patent
Park

(10) Patent No.: US 12,315,832 B2
(45) Date of Patent: May 27, 2025

(54) SEMICONDUCTOR PACKAGES HAVING CONNECTING STRUCTURE

(71) Applicant: Samsung Electronics Co., Ltd., Suwon-si (KR)

(72) Inventor: Kijong Park, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 638 days.

(21) Appl. No.: 17/679,507

(22) Filed: Feb. 24, 2022

(65) Prior Publication Data

US 2023/0014933 A1    Jan. 19, 2023

(30) Foreign Application Priority Data

Jul. 14, 2021    (KR) .................. 10-2021-0092127

(51) Int. Cl.
*H01L 23/00* (2006.01)
*H01L 23/31* (2006.01)
(Continued)

(52) U.S. Cl.
CPC .......... *H01L 24/05* (2013.01); *H01L 23/3107* (2013.01); *H01L 23/49822* (2013.01);
(Continued)

(58) Field of Classification Search
CPC .............. H01L 24/05; H01L 23/3107; H01L 23/49822; H01L 23/49827; H01L 24/48; H01L 25/16; H01L 2224/04042; H01L 2224/48227; H01L 22/32; H01L 23/3128; H01L 24/16; H01L 24/32; H01L 24/73; H01L 24/92; H01L 25/105; H01L 23/49816; H01L 23/49833; H01L 23/5389; H01L 24/20; H01L 24/85; H01L 25/0657; H01L 2224/16225; H01L 2224/32145; H01L 2224/32225; H01L 2224/48091; H01L 2224/73204; H01L 2224/73207; H01L 2224/73265; H01L 2224/8592; H01L 2225/1023; H01L 2225/1058; H01L 2225/107; H01L 2225/1088; H01L 2924/00014; H01L 2924/1431; H01L 2924/1434; H01L 2924/15174;
(Continued)

(56) References Cited

U.S. PATENT DOCUMENTS 7,692,931 B2    4/2010  Chong et al.
7,915,720 B2    3/2011  Tashiro et al.
(Continued)

*Primary Examiner* — Robert G Bachner
(74) *Attorney, Agent, or Firm* — Wolf, Greenfield & Sacks, P.C.

(57) ABSTRACT

A semiconductor package includes a substrate including an upper pad at a top surface of the substrate, a semiconductor chip on the substrate and including a chip pad at a top surface of the semiconductor chip, a connecting structure on the semiconductor chip and including a connecting pad at a top surface of the connecting structure and electrically connected to the upper pad, an encapsulant covering the substrate, the semiconductor chip, and the connecting structure, and a test terminal on the connecting structure and extending through the encapsulant. The connecting structure electrically interconnects the semiconductor chip and the test terminal.

14 Claims, 8 Drawing Sheets

(51) Int. Cl.
*H01L 23/498* (2006.01)
*H01L 25/16* (2023.01)

(52) U.S. Cl.
CPC ........ *H01L 23/49827* (2013.01); *H01L 24/48* (2013.01); *H01L 25/16* (2013.01); *H01L 2224/04042* (2013.01); *H01L 2224/48227* (2013.01)

(58) Field of Classification Search
CPC ..... H01L 2924/15311; H01L 2924/181; H01L 23/28; H01L 25/117; H01L 2225/06596; H01L 2225/1052
See application file for complete search history.

(56) References Cited

U.S. PATENT DOCUMENTS

| | | |
|---|---|---|
| 9,153,507 B2 | 10/2015 | Zhao et al. |
| 9,966,317 B2 | 5/2018 | Kim et al. |
| 10,242,965 B2 | 3/2019 | Chiu et al. |
| 2003/0038351 A1* | 2/2003 | Chien-Chih .......... H01L 21/565 257/684 |
| 2004/0142499 A1 | 7/2004 | Farnworth et al. |
| 2010/0181661 A1 | 7/2010 | Takemoto et al. |
| 2011/0121294 A1* | 5/2011 | Koyama ............ G01R 31/2644 257/E23.01 |
| 2013/0087915 A1* | 4/2013 | Warren ................... H01L 24/11 257/738 |
| 2017/0287733 A1* | 10/2017 | Sato .................. H01L 27/14618 |

\* cited by examiner

SEMICONDUCTOR PACKAGES HAVING CONNECTING STRUCTURE

CROSS-REFERENCE TO THE RELATED APPLICATION

This application claims priority from Korean Patent Application No. 10-2021-0092127, filed on Jul. 14, 2021, in the Korean Intellectual Property Office, the disclosure of which is incorporated herein by reference in its entirety.

BACKGROUND

The example embodiments of the disclosure relate to a semiconductor package having a connecting structure.

After formation of a plurality of semiconductor devices on a wafer through a semiconductor device manufacturing process, an electrical characteristic test for each semiconductor device is performed. The electrical characteristic test may be performed through a method of applying an electrical signal to the semiconductor devices on the wafer, and reading out a signal output corresponding to the applied electrical signal.

SUMMARY

The example embodiments of the disclosure provide a semiconductor package having a connecting structure.

A semiconductor package according to example embodiments of the disclosure may include a substrate including an upper pad at a top surface of the substrate, a semiconductor chip on the substrate and including a chip pad at a top surface of the semiconductor chip, a connecting structure on the semiconductor chip and including a connecting pad at a top surface of the connecting structure and electrically connected to the upper pad, an encapsulant covering the substrate, the semiconductor chip, and the connecting structure, and a test terminal on the connecting structure and extending through the encapsulant. The connecting structure may electrically interconnect the semiconductor chip and the test terminal.

A semiconductor package according to example embodiments of the disclosure may include a lower package, and an upper package on the lower package. The upper package may include an upper substrate including an upper pad at a top surface of the upper substrate, a package connecting terminal at a bottom surface of the upper substrate, an upper semiconductor chip on the upper substrate and including a chip pad at a top surface of the upper semiconductor chip, a connecting structure on the upper semiconductor chip and including a connecting pad at a top surface of the connecting structure and electrically connected to the upper pad, an upper encapsulant covering the upper substrate, the upper semiconductor chip, and the connecting structure, and a test terminal on the connecting structure and extending through the upper encapsulant. The lower package may include a first lower substrate, a lower semiconductor chip on the first lower substrate, and a second lower substrate on the first lower substrate and the lower semiconductor chip and connected to the upper package by the package connecting terminal. The connecting structure may electrically interconnect the upper semiconductor chip and the test terminal.

A semiconductor package according to example embodiments of the disclosure may include a substrate including an upper pad at a top surface of the substrate, an outer connecting terminal at a bottom surface of the substrate, a semiconductor chip on the substrate and including a chip pad at a top surface of the semiconductor chip, a first adhesive between the substrate and the semiconductor chip, a first wire interconnecting the chip pad and the upper pad, a connecting structure on the semiconductor chip and including a connecting pad at a top surface of the connecting structure and electrically connected to the upper pad, a second adhesive between the semiconductor chip and the connecting structure, a second wire interconnecting the connecting pad and the upper pad, an encapsulant covering the substrate, the semiconductor chip, and the connecting structure, and a test terminal on the connecting structure and extending through the encapsulant. The test terminal may protrude upwardly to a higher level than a top surface of the encapsulant, and the connecting structure may electrically interconnect the semiconductor chip and the test terminal.

DETAILED DESCRIPTION

FIGS. 1 to 7 are vertical cross-sectional views illustrating a process order of a method of manufacturing a semiconductor package according to an example embodiment of the inventive concepts.

Figure 1:
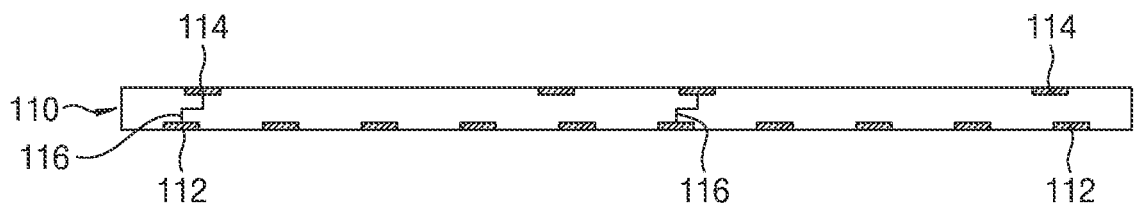
FIGS. 1 to 7 are vertical cross-sectional views illustrating a process order of a method of manufacturing a semiconductor package according to an example embodiment of the inventive concepts.

Referring to FIG. 1, a substrate 110 may be provided. The substrate 110 may include lower pads 112, upper pads 114, and an inner wiring 116. The inner wiring 116 may electrically connect one of the lower pads 112 to a corresponding one of the upper pads 114.

In an embodiment, the substrate 110 may be a printed circuit board, and may include an insulating material such as a phenolic resin, an epoxy resin, a prepreg, or the like. In another embodiment, the substrate 110 may be a redistribution layer in which an insulating material and a conductive material are stacked. The lower pad 112 and the upper pad 114 may include a metal such as aluminum (Al), titanium (Ti), chromium (Cr), iron (Fe), cobalt (Co), nickel (Ni), copper (Cu), zinc (Zn), lead (Pd), platinum (Pt), gold (Au), and silver (Ag). The inner wiring 116 may include copper (Cu), aluminum (Al), tungsten (W), nickel (Ni), titanium (Ti), titanium nitride (TiN), tantalum (Ta), tantalum nitride (TaN), gold (Au), or a combination thereof.

Figure 2:
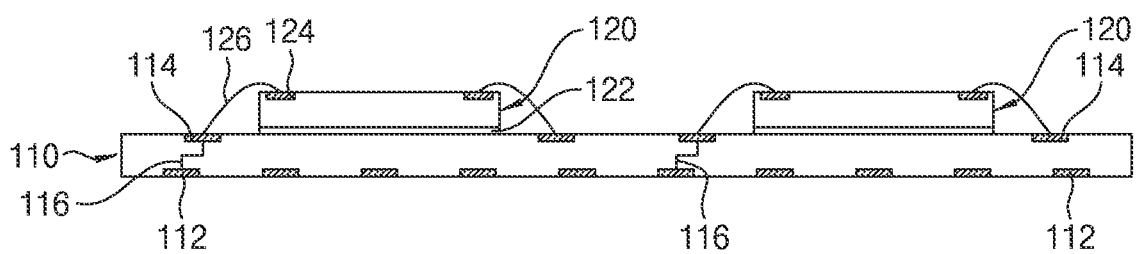

Referring to FIG. 2, semiconductor chips 120 may be mounted on the substrate 110. The semiconductor chip 120 may be mounted on the substrate 110 through wire bonding. For example, the semiconductor chip 120 may be attached to a top surface of the substrate 110 by a first adhesive 122. In addition, the semiconductor chip 120 may include a chip pad 124 disposed at a top surface thereof, and the chip pad 124 may be connected to the upper pad 114 disposed at the top surface of the substrate 110 by a first wire 126. The first adhesive 122 may include a die attach film (DAF) or an epoxy resin.

The semiconductor chip 120 may include a volatile memory chip such as DRAM or a non-volatile memory chip such as flash memory. In an embodiment, the semiconductor chip 120 may include a DRAM chip.

Figure 3:
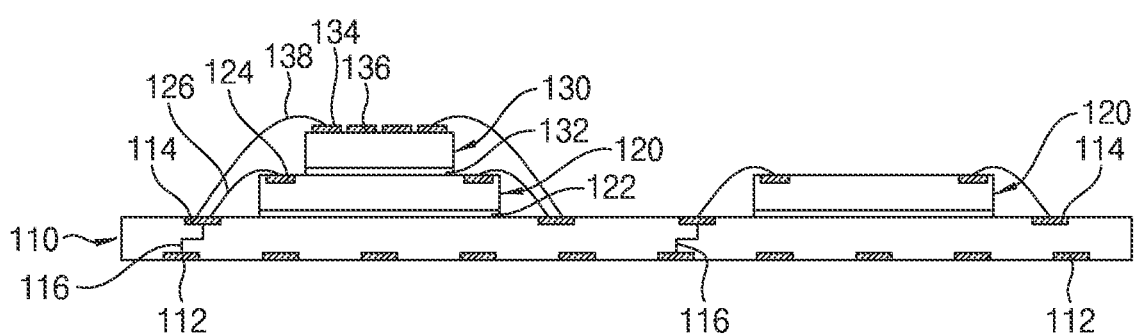

Referring to FIG. 3, a connecting structure 130 may be disposed on the top surface of at least one of the semiconductor chips 120 mounted on the substrate 110. For example, the connecting structure 130 may be attached to the top surface of the semiconductor chip 120 by a second adhesive 132. In an embodiment, the connecting structure 130 may not contact the chip pad 124. For example, the connecting structure 130 may be horizontally spaced apart from the chip pad 124, and may not overlap with the chip pad 124 in a vertical direction. When viewed in cross-section, the horizontal width of the connecting structure 130 may be smaller than the horizontal width of the semiconductor chip 120, and may also be smaller than the distance between the chip pads 124.

The connecting structure 130 may include a connecting pad 134 and a probe pad 136 at a top surface thereof. The connecting pad 134 may be wire-bonded to the substrate 110. For example, the connecting pad 134 may be connected to a corresponding one of the upper pads 114 by a second wire 138. The connecting pad 134 may be electrically connected to a corresponding one of the chip pads 124 via the second wire 138, the upper pad 114, and the first wire 126. In addition, the connecting pad 134 may be electrically connected to a corresponding one of probe pads 136.

Figure 4:
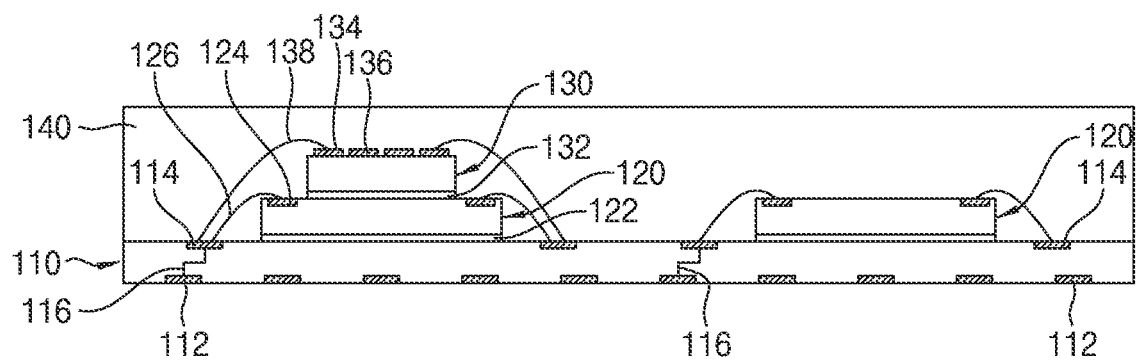

Referring to FIG. 4, an encapsulant 140 may be formed on the resultant structure of FIG. 3. The encapsulant 140 may cover the semiconductor chip 120, the first wire 126, the connecting structure 130, and the second wire 138.

For example, the encapsulant 140 may include a bisphenol-group epoxy resin, a polycyclic aromatic epoxy resin, an o-cresol novolac epoxy resin, a biphenyl-group epoxy resin, a naphthalene-group epoxy resin, or the like.

Figure 5:
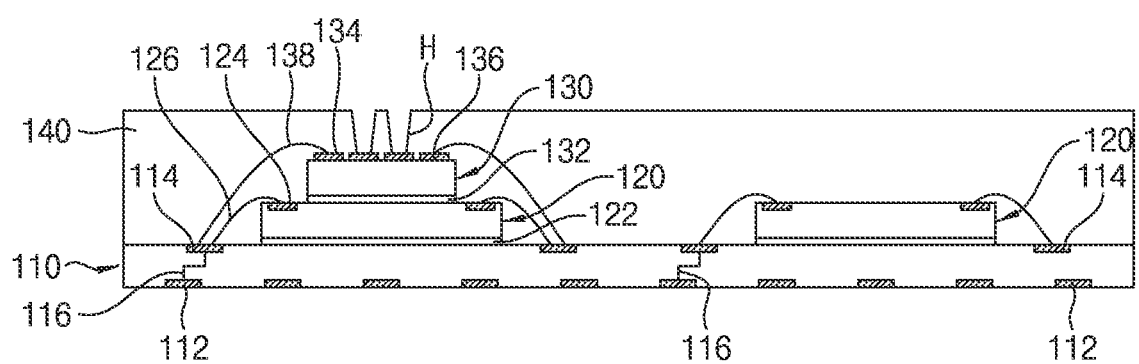

Referring to FIG. 5, a through hole H may be formed by etching the encapsulant 140. The through hole H may expose a top surface of the probe pad 136. In an embodiment, the through hole H may have a tapered shape in which the horizontal width of a side surface of the through hole H is gradually reduced as the through hole H extends downwardly.

Figure 6:
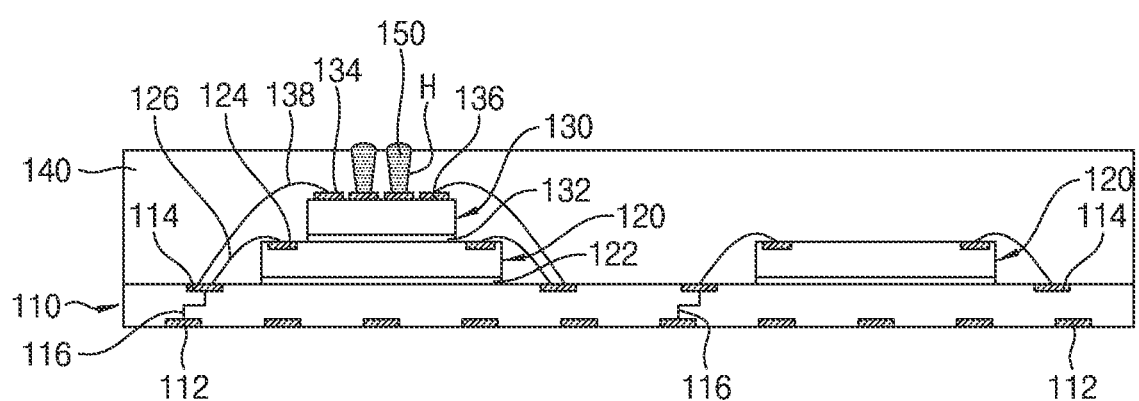

Referring to FIG. 6, a test terminal 150 may be formed within the through hole H. For example, the test terminal 150 may be formed by a filling material filling the through hole H, and then reflowing the filling material. The test terminal 150 may fill an interior of the through hole H, and a bottom surface and a side surface of the test terminal 150 may contact the probe pad 136 and a side wall of the through hole H, respectively. A top surface of the test terminal 150 may be rounded, and an upper end of the test terminal 150 may be disposed vertically at a higher level than a top surface of the encapsulant 140. The test terminal 150 may include a conductive material, and may include, for example, copper (Cu), tin (Sn), or a combination thereof.

Figure 7:
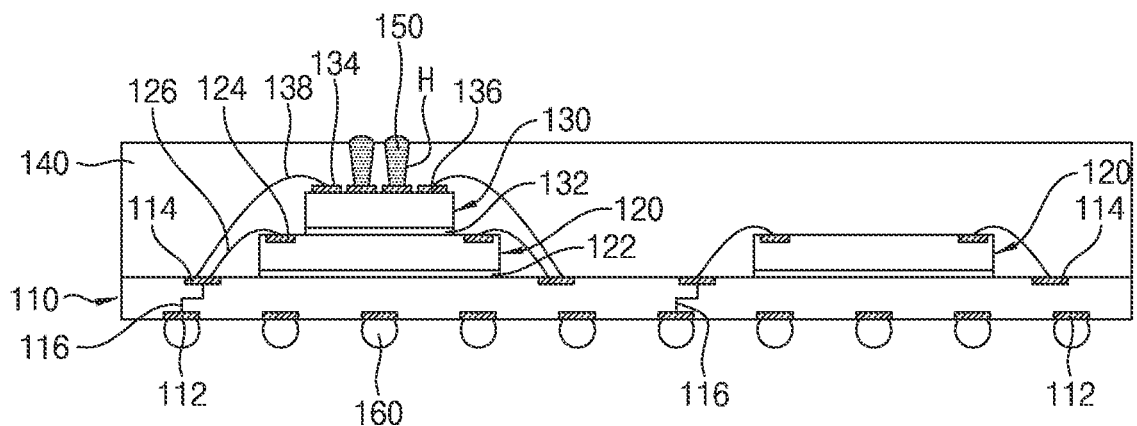

Referring to FIG. 7, outer connecting terminals 160 may be formed at a bottom surface of the substrate 110. The outer connecting terminal 160 may contact a corresponding one of the lower pads 112. The outer connecting terminal 160 may be electrically connected to the upper pad 114 via the lower pad 112 and the inner wiring 116. The outer connecting terminal 160 may be or include a solder bump.

Figure 8:
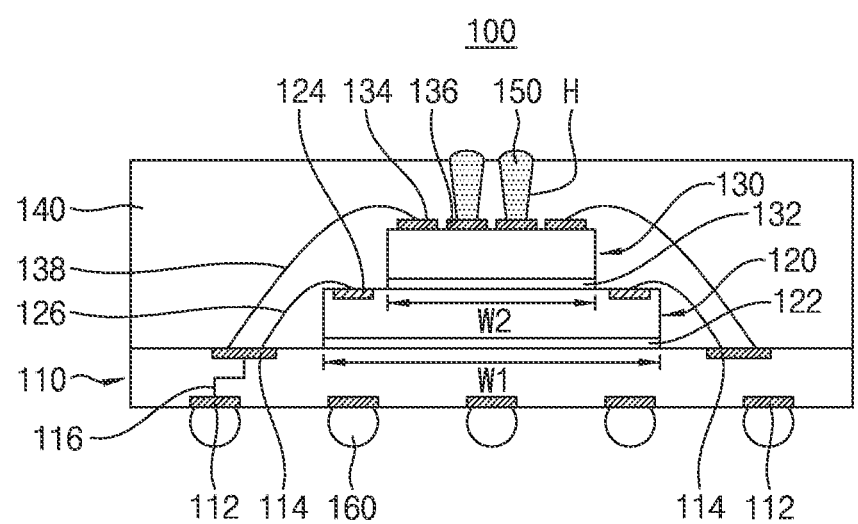
FIG. 8 is a vertical cross-sectional view of a semiconductor package according to an example embodiment of the inventive concepts.
Figure 9:
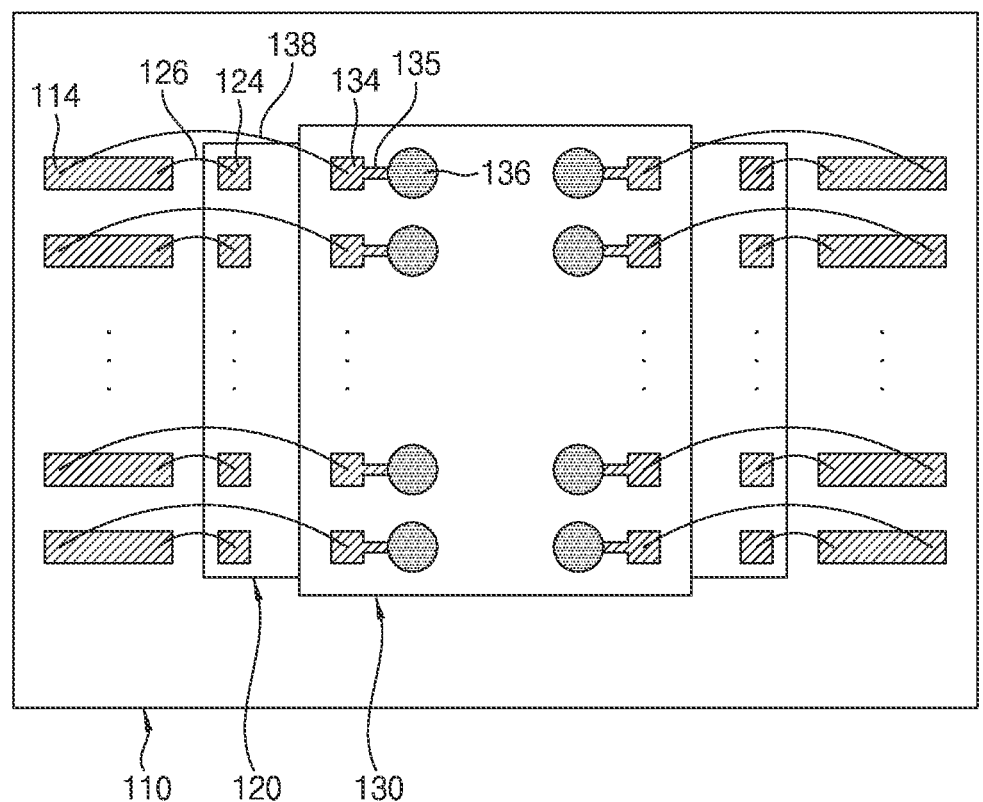
FIG. 9 is a plan view of the semiconductor package shown in FIG. 8.

FIG. 8 is a vertical cross-sectional view of a semiconductor package according to an example embodiment of the inventive concepts. FIG. 9 is a plan view of the semiconductor package shown in FIG. 8.

Referring to FIGS. 8 and 9, a semiconductor package 100 may be formed by a sawing process after formation of an outer connecting terminal 160. The resultant structure of FIG. 7 may be diced along a scribe line by a dicing blade and, as such, the semiconductor chip 120, to which the connecting structure 130 is attached, and the semiconductor chip 120, to which the connecting structure 130 is not attached, may be separated from each other.

The semiconductor package 100 may include a semiconductor chip 120 on a substrate 110, a connecting structure 130 on the semiconductor chip 120, and a test terminal 150 on the connecting structure 130. In an embodiment, the semiconductor package 100 may be used for the purpose of testing the semiconductor chip 120. A portion of the semiconductor package 100, at which the connecting structure 130 is not disposed, may be used in a package-on-package structure.

As described above, when viewed in cross-section, a horizontal width W2 of the connecting structure 130 may be smaller than a horizontal width W1 of the semiconductor chip 120. In addition, the connecting structure 130 may be disposed between chip pads 124. The test terminal 150 may fill an interior of a through hole H, and may contact a probe pad 136. An upper end of the test terminal 150 may be disposed vertically at a higher level than a top surface of the encapsulant 140, and a top surface of the test terminal 150 may be exposed without being covered by the encapsulant 140. The top surface of the test terminal 150 may be rounded, and may be, for example, convex.

When viewed in a plan view, each of upper pads 114 may be connected to a corresponding one of the chip pads 124 by a first wire 126. Each of connecting pads 134 may be connected to a corresponding one of the upper pads 114 by a second wire 138. In addition, the semiconductor package 100 may further include a connecting wiring 135 interconnecting the connecting pad 134 and the probe pad 136. The probe pad 136 may be connected to a single connecting pad 134, the connecting pad 134 may be connected to a single upper pad 114, and the upper pad 114 may be connected to a single chip pad 124. In an embodiment, the number of connecting pads 134 may be equal to the number of upper pads 114 and the number of chip pads 124, without being limited thereto. Although the upper pad 114, the chip pad 124, and the connecting pad 134 are shown as having a quadrangular shape, the example embodiments of the disclosure are not limited thereto. In embodiments, the upper pad 114, the chip pad 124, and the connecting pad 134 may have a shape such as a polygonal or quadrangular shape, a circular chape, an oval shape, etc.

The chip pads 124 may include, for example, ground pads, power pads, AC pads, data pads, and DC pads. The ground pads may be pads for providing a reference potential for circuit operation of devices to be tested, for example, the semiconductor chip 120. The power pads may be pads for supplying power for circuit operation. The AC pads may be pads for supplying AC power to devices to be tested or receiving a signal for execution of an AC test. The DC pads may be pads for measuring a potential level of a particular position in devices to be tested. For example, the DC pads may be pads for testing whether or not a predetermined potential value is applied to a predetermined position in devices to be tested when a driving potential is applied to the devices to be tested. The data pads may be pads for input/output of a logic signal or data.

Figure 10:
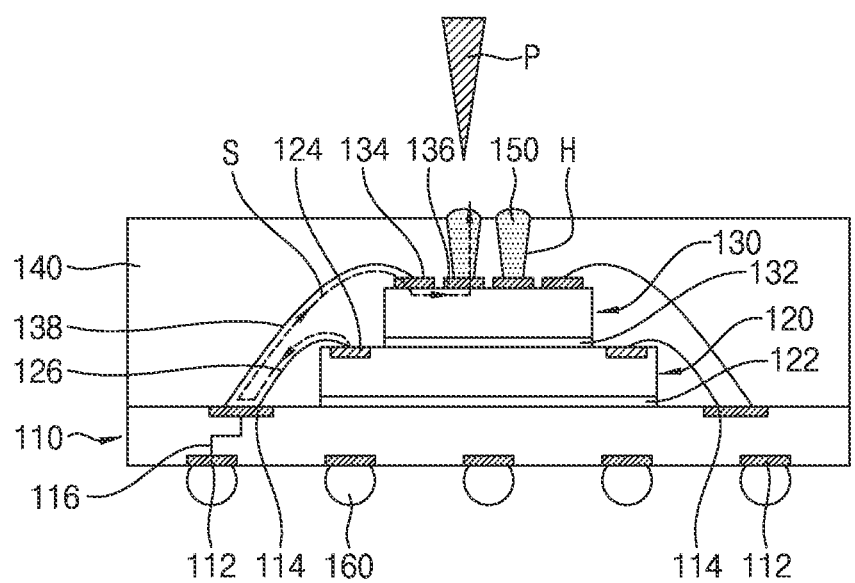
FIG. 10 shows testing of a semiconductor package according to an example embodiment of the disclosure.

FIG. 10 shows testing of a semiconductor package according to an example embodiment of the disclosure.

Referring to FIG. 10, a probe pin P may test performance, characteristics, etc. of a semiconductor chip 120 by transmitting and receiving an electrical signal to and from the semiconductor chip 120 via a test terminal 150 in a semiconductor package 100. The probe pin P may be electrically connected to a chip pad 124 of the semiconductor chip 120 via the test terminal 150. For example, the semiconductor package 100 may provide a signal path S connecting the chip pad 124 to the test terminal 150 via a first wire 126, an upper pad 114, a second wire 138, a connecting pad 134, and a probe pad 136. The probe pin P, which may be included in a probe card (not shown), may read out an electrical signal of the semiconductor chip 120 transferred through the signal path S.

As shown in FIG. 10, upon testing characteristics of the semiconductor package 100, the signal path S may extend from the test terminal 150 to the chip pad 124, and may not pass through the substrate 110 or another configuration. In addition, the test may be performed only for the semiconductor package 100 and, as such, it may be possible to reduce interference of another package or an interposer in a package-on-package structure. Accordingly, accuracy of the test may be enhanced.

Figure 11:
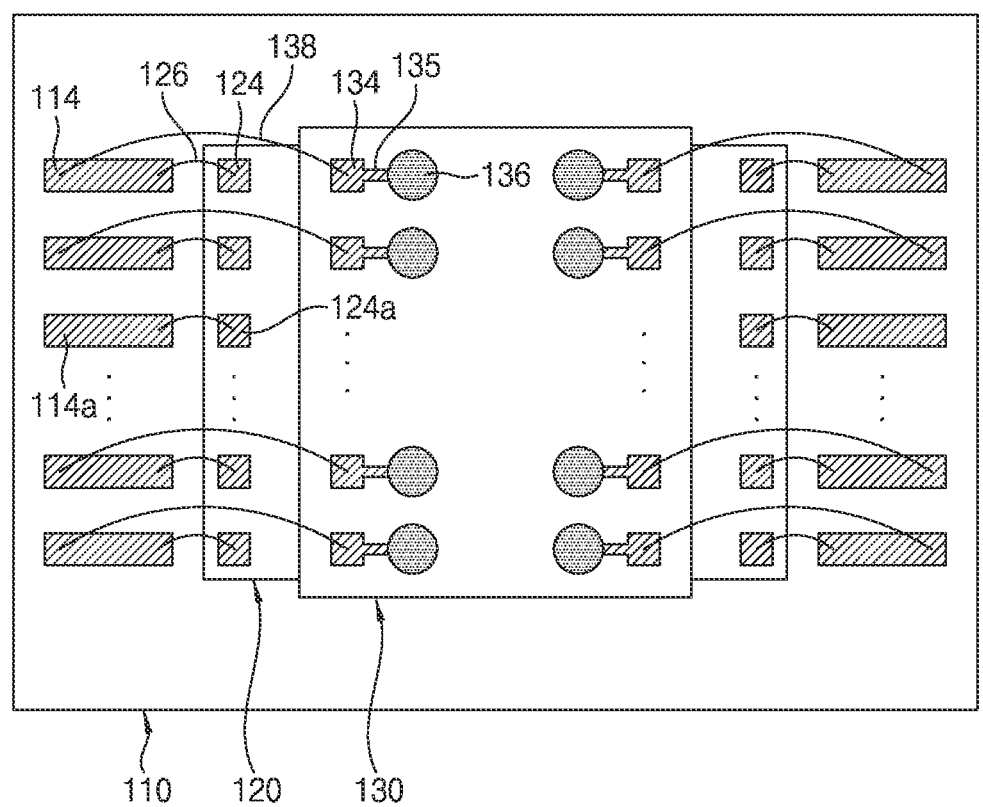
FIG. 11 is a plan view of a semiconductor package according to an example embodiment of the inventive concepts.

FIG. 11 is a plan view of a semiconductor package according to an example embodiment of the inventive concepts.

Referring to FIG. 11, a semiconductor package 110a may include an upper pad 114a and a chip pad 124a which are not connected to a connecting pad 134. In an embodiment, the number of upper pads and the number of chip pads may be different from the number of connecting pads. For example, the number of upper pads may be equal to the number of chip pads, but the number of connecting pads may be smaller than the number of upper pads and the number of chip pads. When chip pads of a semiconductor chip 120 are designed such that only a part of the chip pads is to be tested, the upper pad 114a and the chip pad 124a, which are not electrically connected to the connecting pad 134, may be present.

Figure 12:
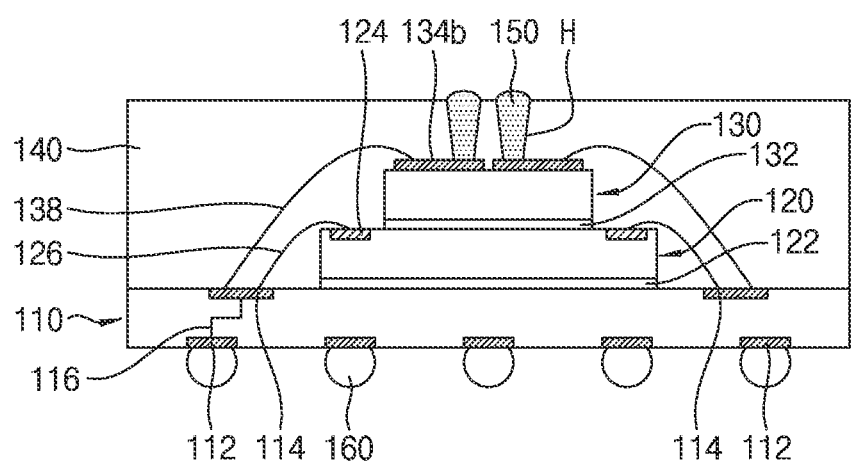
FIG. 12 is a vertical cross-sectional view of a semiconductor package according to an example embodiment of the inventive concepts.
Figure 13:
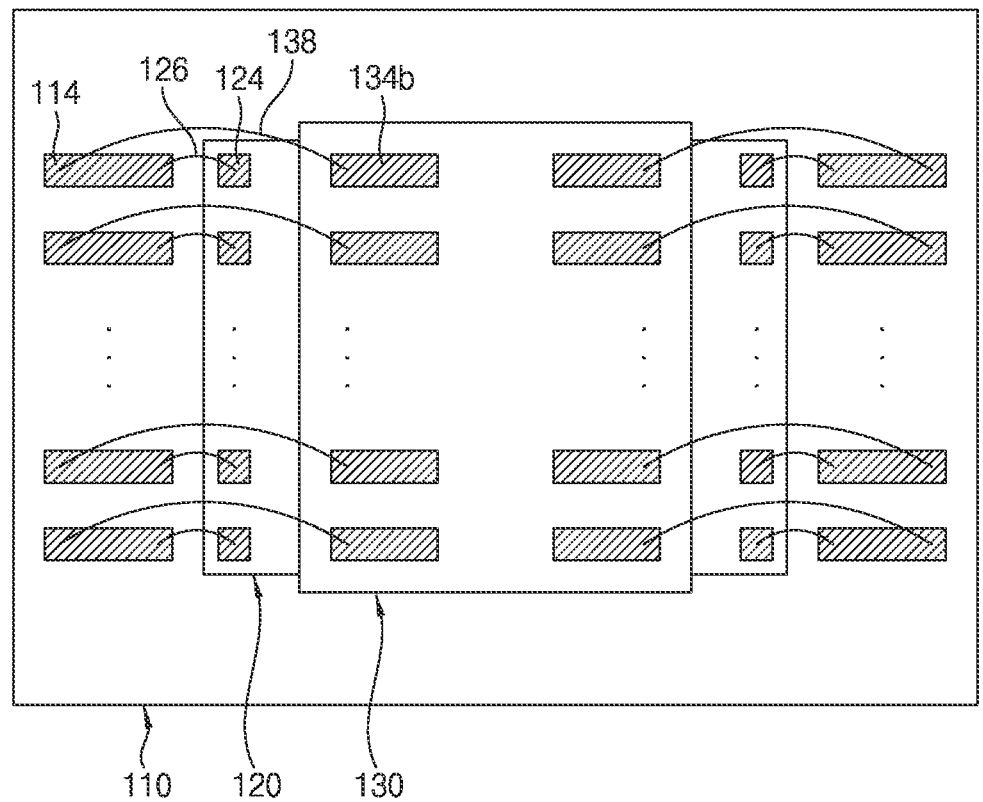
FIG. 13 is a plan view of the semiconductor package shown in FIG. 12.

FIG. 12 is a vertical cross-sectional view of a semiconductor package according to an example embodiment of the inventive concepts. FIG. 13 is a plan view of the semiconductor package shown in FIG. 12.

Referring to FIGS. 12 and 13, a semiconductor package 100b may include a connecting structure 130 including a connecting pad 134b. In an embodiment, a connecting pad 134, a connecting wiring 135, and a probe pad 136, which are shown in FIG. 9, may be integrally formed. The connecting pad 134b may be connected to an upper pad 114 by a second wire 138, and may extend in a horizontal direction and, as such, may contact a test terminal 150. When viewed in a plan view, the connecting pad 134b may have a bar shape or a quadrangular shape, without being limited thereto. In an embodiment, the connecting pad 134b may have a polygonal shape, a circular shape, or an oval shape.

Figure 14:
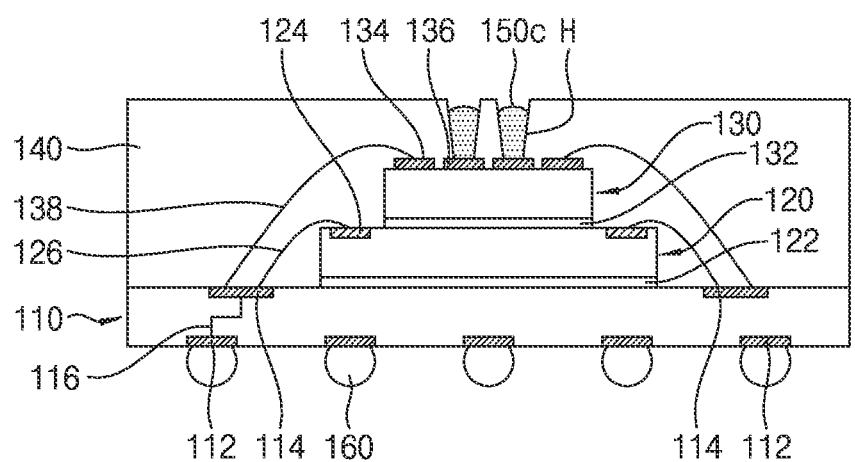
FIGS. 14 to 17 are vertical cross-sectional views of semiconductor packages according to example embodiments of the inventive concepts.

FIGS. 14 to 17 are vertical cross-sectional views of semiconductor packages according to example embodiments of the inventive concepts Referring to FIG. 14, a semiconductor package 100c may include a test terminal 150c electrically connected to a chip pad 124 of a semiconductor chip 120. In an embodiment, the test terminal 150c may incompletely fill an interior of a through hole H. For example, a side wall of the through hole H may be partially exposed, and an upper end of the test terminal 150c may be disposed vertically at a level lower than or equal to a top surface of an encapsulant 140. A top surface of the test terminal 150c may be rounded, and may be, for example, convex.

Figure 15:
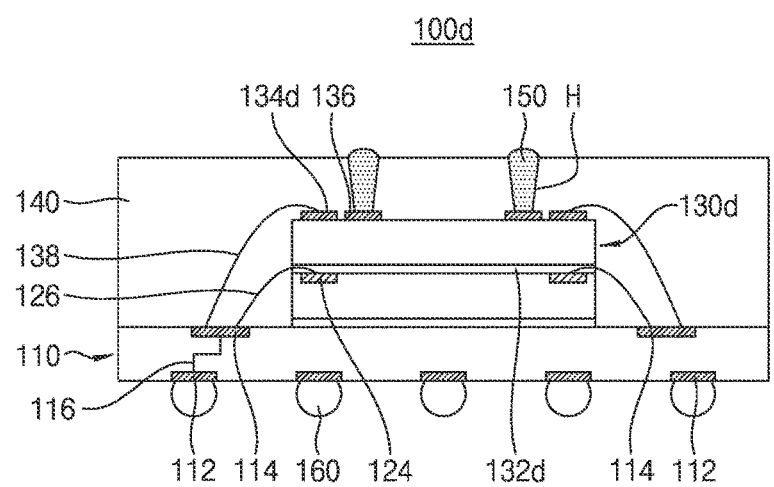

Referring to FIG. 15, a semiconductor package 100d may include a connecting structure 130d electrically interconnecting a semiconductor chip 120 and a test terminal 150. In an embodiment, the horizontal width of the connecting structure 130d may be equal to the horizontal width of the semiconductor chip 120, and a side surface of the connecting structure 130d may be coplanar with a side surface of the semiconductor chip 120. A second adhesive 132d, which fixes the connecting structure 130d to the semiconductor chip 120, may partially cover a first wire 126. Although a chip pad 124 is shown in FIG. 15 as overlapping with or being aligned with a connecting pad 134d in a vertical direction, the example embodiments of the disclosure are not limited thereto.

Figure 16:
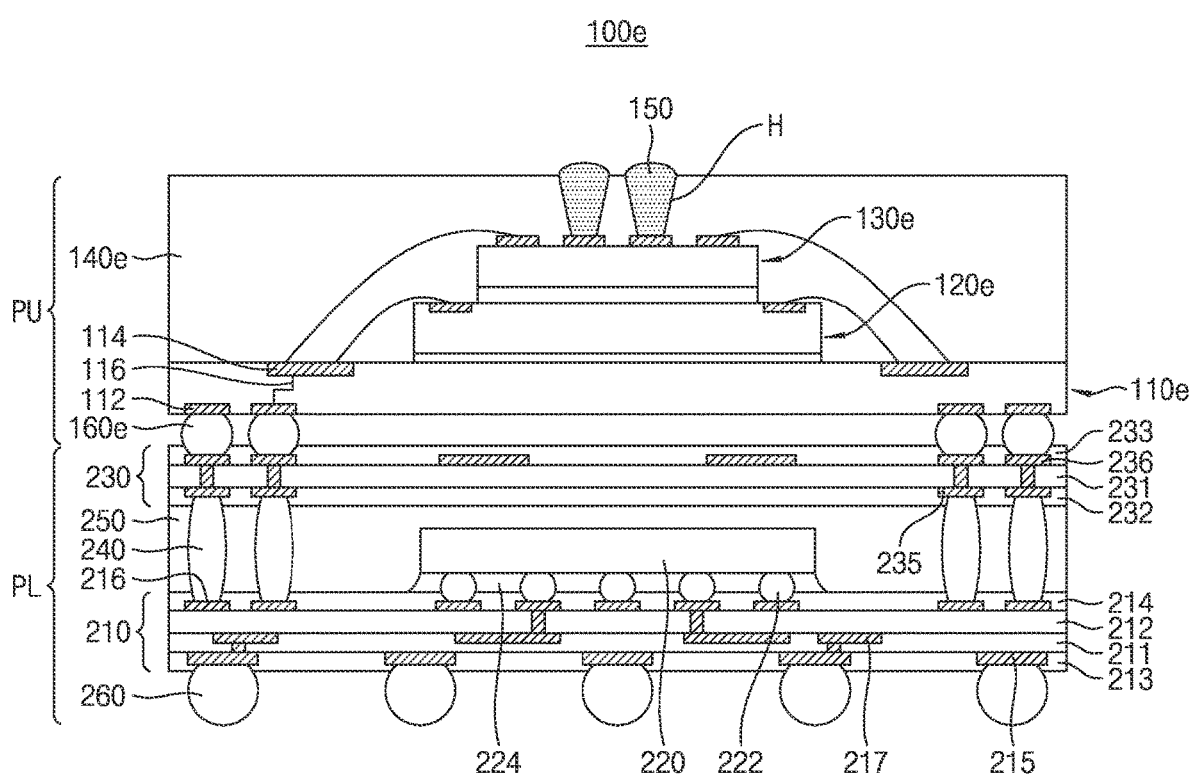

Referring to FIG. 16, a semiconductor package 100e may include an upper package PU, and a lower package PL connected to the upper package PU. The upper package PU may include an upper substrate 110e, an upper semiconductor chip 120e, a connecting structure 130e, an upper encapsulant 140e, and a package connecting terminal 160e. The upper substrate 110e, the upper semiconductor chip 120e, the connecting structure 130e, the upper encapsulant 140e, and the package connecting terminal 160e may correspond to the substrate 110, the semiconductor chip 120, the connecting structure 130, the upper encapsulant 140, and the outer connecting terminal 160 of the semiconductor package 100, respectively. The upper package PU may have a configuration identical or similar to that of the semiconductor package 100 and, as such, an overlapping description thereof may not be given in the interest of brevity. As described with reference to FIG. 8, a test terminal 150 may be electrically connected to a chip pad 124, and may be used to test the upper semiconductor chip 120e.

The lower package PL may include a first lower substrate 210, a lower semiconductor chip 220, a second lower substrate 230, a conductive pillar 240, a lower encapsulant 250, and an outer connecting terminal 260.

The first lower substrate 210 may include an insulating layer 211 (or a first insulating layer 211), an insulating layer 212 (or a second insulating layer 212), a lower protective layer 213, an upper protective layer 214, a lower pad 215, an upper pad 216, and a wiring 217. The insulating layer 212 may be disposed on the insulating layer 211. The lower protective layer 213 may be disposed under the insulating layer 211, and the upper protective layer 214 may be disposed on the insulating layer 212. The lower pad 215 may be disposed under the insulating layer 211, and may be partially covered by the lower protective layer 213. The upper pad 216 may be disposed on the insulating layer 212, and may be partially covered by the upper protective layer 214. The wiring 217 may be disposed in the insulating layer 211 and the insulating layer 212, and may be electrically connected to the lower pad 215 or the upper pad 216.

In an embodiment, the first lower substrate 210 may be a printed circuit board. The insulating layer 211 and the insulating layer 212 may include an insulating material such as a phenolic resin, an epoxy resin, a prepreg, or the like. In an embodiment, the first lower substrate 210 may be a redistribution layer in which an insulating material and a conductive material are stacked. The upper protective layer 214 and the lower protective layer 213 may include a photosensitive solder resist film. The photosensitive solder resist film may include a photosensitive polymer.

The lower semiconductor chip 220 may be disposed on the first lower substrate 210. The lower semiconductor chip 220 may be mounted on the first lower substrate 210 through flip-chip bonding. For example, the lower package PL may further include a chip connecting terminal 222 interconnecting the lower semiconductor chip 220 and the first lower substrate 210, and an underfill 224 under the lower semiconductor chip 220. The chip connecting terminal 222 may be disposed under the lower semiconductor chip 220, and may contact the upper pad 216. The underfill 224 may cover the chip connecting terminal 222, and may fill a space between the first lower substrate 210 and the lower semiconductor chip 220. The underfill 224 may protect the chip connecting terminal 222. In an embodiment, the lower semiconductor chip 220 may be mounted on the first lower substrate 210 through wire bonding. The chip connecting terminal 222 may be or include a micro solder bump. The underfill 224 may include a non-conductive paste (NCP), a non-conductive film (NCF), a capillary underfill (CUF), or other insulating materials.

The upper semiconductor chip 120e of the upper package PU and the lower semiconductor chip 220 of the lower package PL may be different kinds of semiconductor devices, respectively. For example, the lower semiconductor chip 220 may include an application processor chip such as a microprocessor, a microcontroller, etc. or a logic chip such as a CPU, a GPU, a modem, an ASIC, an FPGA, etc. The upper semiconductor chip 120e may include a volatile memory chip such as DRAM or a non-volatile memory chip such as flash memory.

The second lower substrate 230 may be disposed on the first lower substrate 210 and the lower semiconductor chip 220. For example, the second lower substrate 230 may be electrically connected to the first lower substrate 210 by the conductive pillar 240, which extends in a vertical direction. The second lower substrate 230 may include an insulating layer 231, a lower protective layer 232, an upper protective layer 233, a lower pad 235, and an upper pad 236. The lower protective layer 232 and the upper protective layer 233 may be disposed under and on the insulating layer 231, respectively. The lower pad 235 may be disposed under the insulating layer 231, and may be partially covered by the lower protective layer 232. The upper pad 236 may be disposed on the insulating layer 231, and may be partially covered by the upper protective layer 233. The lower pad 235 may be electrically connected to the upper pad 236. In an embodiment, the second lower substrate 230 may be a printed circuit board. However, the example embodiments of the disclosure are not limited to the above-described condition, and the second lower substrate 230 may be a redistribution layer in which an insulating material and a conductive material are stacked.

The conductive pillar 240 may be electrically connected to the first lower substrate 210 and the second lower substrate 230. For example, the conductive pillar 240 may be connected to the upper pad 216 of the first lower substrate 210 and the lower pad 235 of the second lower substrate 230. The height of the conductive pillar 240 may be greater than the height of the lower semiconductor chip 220. For example, a top surface of the conductive pillar 240 may be disposed vertically at a higher level than a top surface of the lower semiconductor chip 220, and the top surface of the lower semiconductor chip 220 may not contact the second lower substrate 230. In an embodiment, the conductive pillar 240 may include a solder. The conductive pillar 240 may further include a metal column disposed in the conductive pillar 240 in order to support the second lower substrate 230. The metal column may include, for example, copper.

The lower encapsulant 250 may fill a space between the first lower substrate 210 and the second lower substrate 230. For example, the lower encapsulant 250 may cover the first lower substrate 210, the lower semiconductor chip 220, and the conductive pillar 240. The lower encapsulant 250 may protect the lower semiconductor chip 220 and the conductive pillar 240. The lower encapsulant 250 may include the same material as the upper encapsulant 140e.

The outer connecting terminal 260 may be disposed under the first lower substrate 210, and may contact the lower pad 215. The outer connecting terminal 260 may be electrically connected to the lower semiconductor chip 220 via the first lower substrate 210. In addition, the outer connecting terminal 260 may be electrically connected to the second lower substrate 230 via the first lower substrate 210 and the conductive pillar 240.

Figure 17:
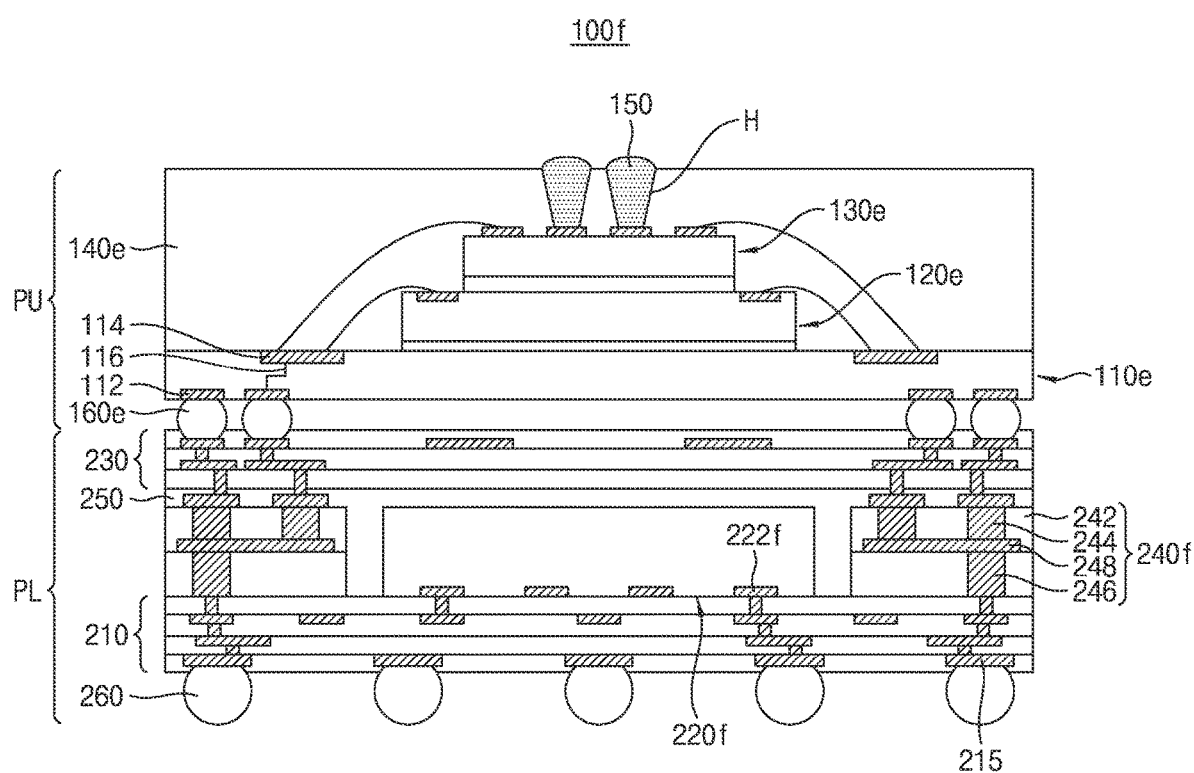

Referring to FIG. 17, a semiconductor package 100f may include an upper package PU, and a lower package PL connected to the upper package PU. In an embodiment, the lower package PL may be a panel-level packaging (PLP) type package. The lower package PL may include a first lower substrate 210, a lower semiconductor chip 220f, a second lower substrate 230, a connecting member 240f, a lower encapsulant 250, and an outer connecting terminal 260. The first lower substrate 210, the second lower substrate 230, the lower encapsulant 250, and the outer connecting terminal 260 of the semiconductor package 100f may be identical or similar to corresponding configurations of the semiconductor package 100e, respectively, and, as such, an overlapping description thereof may not be given in the interest of brevity.

The lower semiconductor chip 220f may be mounted on the first lower substrate 210, and, for example, a bottom surface of the lower semiconductor chip 220f may contact the first lower substrate 210. The lower semiconductor chip 220f may include a lower chip pad 222f disposed at the bottom surface of the lower semiconductor chip 220f, and the lower chip pad 222f may be electrically connected to the first lower substrate 210.

The connecting member 240f may include a base layer 242, a conductive via 244 (or a first conductive via 244), a conductive via 246 (or a second conductive via 246), and a wiring 248. Base layers 242 may be stacked adjacent to the lower semiconductor chip 220f, and the conductive via 244 and the conductive via 246 may extend through the base layers 242 in a vertical direction. For example, the first conductive via 244 may extend through a first base layer 242 and the second conductive via 246 may extend through a second base layer 242. The wiring 248 may electrically interconnect the conductive via 244 and the conductive via 246. The conductive via 244 of the connecting member 240f may be electrically connected to the second lower substrate 230. In an embodiment, the base layer 242 may be constituted by one or more layers, and may include silicon oxide, silicon nitride, silicon oxynitride, or a combination thereof.

In accordance with the example embodiments of the disclosure, test accuracy of a semiconductor package may be enhanced.

While the embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:

1. A semiconductor package comprising:
a substrate including an upper pad at a top surface of the substrate;
a semiconductor chip on the substrate and including a chip pad at a top surface of the semiconductor chip, wherein the chip pad is electrically connected to the upper pad via a first wire;
a connecting structure on the semiconductor chip and including a connecting pad and a probe pad at a top surface of the connecting structure, wherein the connecting pad is electrically connected to the probe pad via a third wire, and the connecting pad is electrically connected to the upper pad via a second wire;
an encapsulant covering and in direct contact with each of the substrate, the semiconductor chip, and the connecting structure; and
a test terminal on the connecting structure and extending through the encapsulant, the test terminal being electrically connected to and in direct contact with the probe pad of the connecting structure;
wherein the connecting structure electrically interconnects the semiconductor chip and the test terminal via a signal path that passes from the test terminal to the probe pad of the connecting structure, from the probe pad of the connecting structure to the connecting pad of the connecting structure via the third wire, from the connecting pad of the connecting structure to the upper pad of the substrate via the second wire, and from the upper pad of the substrate to the chip pad of the semiconductor chip via the first wire.

2. The semiconductor package according to claim 1, wherein:
a horizontal width of the connecting structure is smaller than a horizontal width of the semiconductor chip; and
the connecting structure does not overlap with the chip pad in a vertical direction.

3. The semiconductor package according to claim 1, wherein an upper end of the test terminal is disposed vertically at a higher level than a top surface of the encapsulant.

4. The semiconductor package according to claim 3, wherein a top surface of the test terminal is rounded.

5. The semiconductor package according to claim 1, wherein the connecting pad contacts a bottom surface of the test terminal.

6. The semiconductor package according to claim 1, wherein:
the encapsulant includes a through hole in which the test terminal is disposed; and an inner wall of the through hole is partially exposed.

7. The semiconductor package according to claim 6, wherein an upper end of the test terminal is disposed vertically at a lower level than a top surface of the encapsulant.

8. The semiconductor package according to claim 1, wherein:
a side surface of the connecting structure and a side surface of the semiconductor chip are coplanar; and
a horizontal width of the connecting structure is equal to a horizontal width of the semiconductor chip.

9. The semiconductor package according to claim 1, wherein the semiconductor chip is a memory chip.

10. A semiconductor package comprising:
a lower package, and an upper package on the lower package,
wherein the upper package includes:
an upper substrate including an upper pad at a top surface of the upper substrate,
a package connecting terminal at a bottom surface of the upper substrate,
an upper semiconductor chip on the upper substrate and including a chip pad at a top surface of the upper semiconductor chip, wherein the chip pad is electrically connected to the upper pad via a first wire,
a connecting structure on the upper semiconductor chip and including a connecting pad and a probe pad at a top surface of the connecting structure, wherein the connecting pad is electrically connected to the probe pad via a third wire, and the connecting pad is and electrically connected to the upper pad via a second wire,
an upper encapsulant covering and in direct contact with each of the upper substrate, the upper semiconductor chip, and the connecting structure, and
a test terminal on the connecting structure and extending through the upper encapsulant, the test terminal being electrically connected to and in direct contact with the probe pad of the connecting structure;
wherein the lower package includes:
a first lower substrate,
a lower semiconductor chip on the first lower substrate, and
a second lower substrate on the first lower substrate and the lower semiconductor chip and connected to the upper package by the package connecting terminal,
wherein the connecting structure electrically interconnects the upper semiconductor chip and the test terminal via a signal path that passes from the test terminal to the probe pad of the connecting structure, from the probe pad of the connecting structure to the connecting pad of the connecting structure via the third wire, from the connecting pad of the connecting structure to the upper pad of the upper substrate via the second wire, and from the upper pad of the upper substrate to the chip pad of the semiconductor chip via the first wire.

11. The semiconductor package according to claim 10, further comprises:
a conductive pillar interconnecting the first lower substrate and the second lower substrate.

12. The semiconductor package according to claim 10, further comprising:
a connecting member interconnecting the first lower substrate and the second lower substrate,
wherein the connecting member includes base layers and conductive vias extending through the base layers.

13. The semiconductor package according to claim 10, wherein:
the upper semiconductor chip includes a memory chip; and
the lower semiconductor chip includes a logic chip.

14. A semiconductor package comprising:
a substrate including an upper pad at a top surface of the substrate;
an outer connecting terminal at a bottom surface of the substrate;
a semiconductor chip disposed on the substrate and including a chip pad at a top surface of the semiconductor chip, wherein the chip pad is electrically connected to the upper pad via a first wire interconnecting the chip pad and the upper pad;

a first adhesive between the substrate and the semiconductor chip;

a connecting structure on the semiconductor chip and including a connecting pad and a probe pad at a top surface of the connecting structure, wherein the connecting pad is electrically connected to the probe pad via a third wire, and the connecting pad is electrically connected to the upper pad via a second wire interconnecting the connecting pad and the upper pad;

a second adhesive between the semiconductor chip and the connecting structure;

an encapsulant covering and in direct contact with each of the substrate, the semiconductor chip, and the connecting structure; and a test terminal on the connecting structure and extending through the encapsulant, the test terminal being electrically connected to and in direct contact with the probe pad of the connecting structure;

wherein the test terminal protrudes upwardly to a higher level than a top surface of the encapsulant, wherein the connecting structure electrically interconnects the semiconductor chip and the test terminal via a signal path that passes from the test terminal to the probe pad of the connecting structure, from the probe pad of the connecting structure to the connecting pad of the connecting structure via the third wire, from the connecting pad of the connecting structure to the upper pad of the substrate via the second wire, and from the upper pad of the substrate to the chip pad of the semiconductor chip via the first wire.

* * * * *